Jan. 22, 1963
R. B. HANSEN
3,075,171
REMOTE CONTROL RECEIVER
Filed June 15, 1959
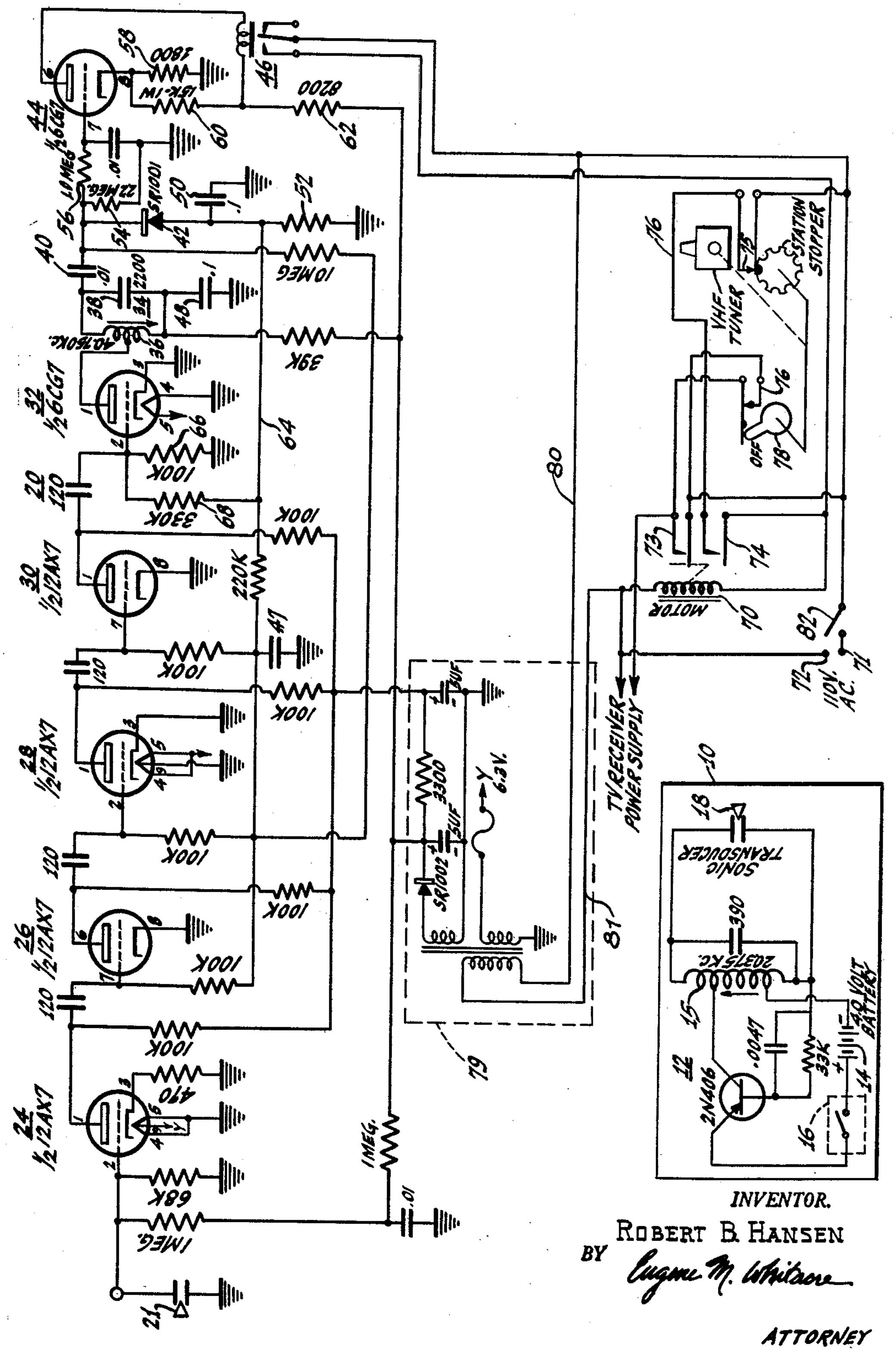
INVENTOR.
ROBERT B. HANSEN
BY Eugene M. Whitacre
ATTORNEY United States Patent Office 3,075,171
Patented Jan. 22, 1963

3,075,171

REMOTE CONTROL RECEIVER

Robert B. Hansen, Riverton, N.J., assignor to Radio Corporation of America, a corporation of Delaware Filed June 15, 1959, Ser. No. 820,464
11 Claims. (Cl. 340—15)

This invention relates to wireless remote control systems, and more particularly relates to remote control receivers of the type which are responsive to received radio control waves or sound control waves, of predetermined frequency to control, in a desired manner, the operation of an electric circuit connected with the receiver.

Various types of wireless remote control systems have heretofore been proposed wherein a local transmitter is caused to radiate radio or sound control signal waves having predetermined frequency or modulation characteristics for reception by, and control of, remotely located apparatus. Systems of this type have been commonly used to control the operation of remotely located radio or television receivers thereby enabling the listener or viewer to adjust the tuning or volume, etc. without moving to the receiver location.

A problem encountered in the design of remote control systems of this type is erroneous actuation of remote circuits when the frequency of spurious radiations from electronic equipment (for systems using radio waves), or random waves from jingling keys or coins (for systems using sound waves), corresponds to the frequency of the control signal. To overcome this problem, remote control receivers have been provided with sharply tuned resonant circuits to select the proper control signal and reject spurious signals. Sharply tuned or high Q resonant circuits, particularly those which are resonant at the low frequencies which are commonly used for the remote control of home type receivers, are relatively expensive thereby increasing the overall cost of the remote control system.

Accordingly, it is an object of this invention to provide an improved wireless remote control system.

It is a further object of this invention to provide an improved remote control receiver which does not require expensive sharply tuned or high Q circuit elements.

Another object of this invention is to provide an improved remote control receiver which exhibits enhanced immunity to undesired actuation by spurious or random signals.

A remote control receiver embodying the invention is provided with a relatively wide frequency band, variable gain amplifying channel, which may use inexpensive resistance capacitance coupling techniques. The amplifying channel is coupled to drive a resonant circuit which is tuned to the frequency of a predetermined control signal. Signals developed across the resonant circuit in response to a received control signal are applied to a rectifier circuit to derive a control voltage which is utilized to control the operation of a desired electric circuit, such as a tuner drive motor circuit, for example. The rectifier circuit also produces a gain controlling voltage which is applied to the variable gain amplifying channel to keep the amplitude of the signal applied to the resonant circuit relatively constant throughout the normal operating range of the receiver. Since this is narrow band AGC, wide frequency band energy (impulse noise, etc.), arrives at full amplitude at the resonant circuit, and could cause a control voltage to be produced which would produce erroneous actuation of the electric control circuit.

In accordance with the invention, detector means are provided in the variable gain amplifying channel to derive a second gain controlling voltage in response to relatively wide frequency band energy. The second gain controlling voltage is matrixed into the AGC line to reduce the level of the wide frequency band information applied to the resonant circuit. This substantially reduces the susceptibility of the remote control receiver to noise which is characterized by a wide frequency spectrum, and permits the use of inexpensive lower Q tuning elements in the resonant circuit.

A feature of the invention is that the second gain controlling voltage developed by the detector means in the variable gain amplifying channel is applied to the rectifier in a manner to increase the reverse bias thereon in response to increasing wide frequency band signal levels corresponding to noise. This tends to prevent the detection of those components of the noise signal which may be developed across the resonant circuit and result in the development of an erroneous control voltage.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawing in which the sole FIGURE is a schematic circuit diagram of a supersonic remote control transmitter, and a receiver which is responsive to supersonic sound waves from the transmitter to actuate a control circuit.

The transmitter 10 of the remote control system includes a transistor oscillator 12 which is powered by battery 14. The transistor oscillator is connected in a Hartley oscillator circuit configuration with the connections from the transistor emitter electrode being completed through a normally open switch 16, which is actuated by a suitable push-button mechanism, to a tap of the oscillator tuning inductor 15. When the switch 16 is closed, biasing voltages are applied to the various electrodes of the transistor to produce oscillations. The frequency of oscillation is determined by the resonance of the oscillator tuning circuit which includes the tuning inductor 15 and the various shunt capacities thereacross. The output frequency may, for example, be one half the desired control signal frequency. Signals developed by the oscillator are applied to a sonic transducer 18 which is operated as a loudspeaker to produce a sound output wave at the second harmonic of the oscillator frequency. By way of example, the oscillator circuit 12 and sonic transducer 18 may be designed to transmit a 40 kc. supersonic control wave, which is the second harmonic of the fundamental frequency of the transistor oscillator. It should be understood that any suitable transmitter may be used with remote control receiver of the invention.

A sonic wave transmitted by the transmitter 10 is picked up and transduced by the remote control receiver 20 to actuate a desired remote function, which in the present case is a tuning control circuit for the tuner of the television receiver. More specifically, the supersonic control wave is transduced by a microphone 21, which may be of the same or similar construction as the sonic transducer 18, to produce a corresponding electrical signal. The transduced control signal is applied to an amplifier channel including a preamplifier 24, and a plurality of cascade connected variable gain amplifiers 26, 28 and 30. The output signal from the variable gain amplifier 30 is applied to a driver amplifier 32 which provides sufficient power amplification of the control signal voltage to drive the resonant circuit 34.

The resonant circuit 34 includes the parallel connected inductor 36 and capacitor 38 which are tuned to resonance at the frequency of the transmitted control signal. The alternating current signals developed across the resonant circuit 34 are coupled to the cathode of a rectifier 42 through a coupling capacitor 40, and to the anode of the rectifier 42 to the capacitors 48 and 50. The D.C. current path for the rectifier 42 includes a resistor 52 connected between the anode of the rectifier and ground, and a resistor 54 connected to the cathode and ground.

A 40 kc. control signal developed across the resonant circuit 34 causes the rectifier 42 to conduct and develop a positive going voltage at the cathode thereof (across the resistor 54), which is applied through an isolating resistor 56 to the control electrode of the relay tube 44. This positive voltage causes the relay tube to conduct and energize the relay 46.

The threshold of conduction of the relay tube 44 is determined by the resistors 58, 60 and 62 which are connected in series between ground and the positive terminal of the operating potential supply source. The resistors 58 and 62 are both in the relay tube 44 current path. The resistor 62 is selected to provide a negative going voltage when the relay tube 44 conducts, which tends to cancel the degenerative effects of the voltage developed across cathode resistor 58 due to the tube current, thus allowing a low current voltage divider to derive the threshold bias.

The normally open relay 46 contacts are in the power circuit of the tuner drive motor. The tuner drive motor circuit includes suitable programmed switching circuits so that after the initial closure of the relay 46 contacts, the programmed switching circuit assumes control so that the tuning motor remains energized until the tuner is set at the next preset television station. In the circuits shown in the drawing, at one position of the tuner, the television receiver will be deenergized. Thus, a single control circuit is operable to control the receiver tuning and also the television receiver on-off.

More specifically, the tuning motor includes a winding 70 which is energized from a pair of power terminals 71 and 72 which may, for example, be connected to the usual alternating current power mains. One side of the motor winding 70 is connected directly to the power terminal 72, and the other side of the motor winding is connected to the power terminal 71 through the contacts of the relay 46. After the motor is energized by the closure of the relay 46 contacts, the rotation thereof causes the latch contacts 73 and 74 to close by virtue of the motor armature end play. The motor power circuit is then completed directly from the terminal 72, and from the terminal 71 through a set of contacts 75 and the contacts 74 to the bottom side of the motor winding 70. The contacts 75 comprise a programmed switch, which is driven by the tuner motor, and which is preset so that the contacts 75 will be closed except when the tuner is in a desired channel position, or when the tuner is in the television receiver off position.

The television receiver power supply is energized directly from power terminal 72 and from the power terminal 71 through the cam operated contacts 76 and the contacts 73. When the tuner is in the television receiver-off position, the cam 78 opens the contacts 76 to break the power circuit to the television receiver power supply thereby deenergizing the television receiver.

The remote control receiver power supply 79 which provides the direct voltage for energizing the various tube circuits of the remote control receiver, is connected directly to the power terminals 71 and 72 through the conductors 80 and 81 respectively.

In operation, momentary closure of the relay 46 contacts causes the motor to be energized, whereupon the latch contacts 73 and 74 close. This maintains a power circuit path to the motor winding 70 after the relay contacts 46 open. The motor then rotates until the program switch 75 arrives at a position corresponding to the next desired channel setting of the tuner at which time the contacts 75 are opened and the motor is deenergized. Thus, by successive transmission of a control signal of a given frequency from the transmitter 10, a television receiver may be not only tuned from channel to channel, but the television receiver power circuits may be deenergized. Both the television receiver and remote control receiver can be deenergized by opening the master on-off switch 82.

The direct current through the rectifier 42 also causes a negative voltage to be developed at the anode thereof which is applied through an AGC conductor 64 to the control electrodes of the variable gain amplifier stages 26, 28 and 30 to control the gain thereof as an inverse function of the level of the received control signal. The result is a narrow band AGC which keeps a relatively constant amplitude control signal level at the control electrode of the driver amplifier 32 and at the resonant circuit 34 throughout the normal operating range of the receiver. Since this is narrow frequency-band AGC, wide frequency-band energy (impulse noise, etc.) arrives at full amplitude at the grid of the driver amplifier 32. The large amplitude, wide frequency band energy causes current rectification between the grid and cathode of the driver amplitude 32 to produce a current through a resistor 66 which causes a voltage to be developed which is proportional to the undesired wide frequency band energy.

This negative going direct voltage is then matrixed to the AGC line 64 through the resistor 68 which in effect reduces the amplifier gain. The voltage appearing across resistor 66 is also applied through the resistor 68 to the anode of the rectifier 42 so that the rectifier is increasingly reverse biased for increasing signal levels. This has the advantage of preventing rectifier conduction in response to some level of the wide frequency band noise that corresponds to the frequency of the predetermined control signal which might be present across the resonant circuit 34.

The AGC voltage developed by the rectifier 42 in combination with the effective noise cancellation produced by the current rectification at the control grid of the amplifier 32 substantially reduces the susceptibility of the remote control receiver to erroneous actuation of spurious signal components or noise, and thereby permits the use of relatively low Q and hence less expensive circuit elements in the resonant circuit 34.

What is claimed is:

1. In a remote control receiver of the type which is responsive to a transmitted control signal of a predetermined frequency for actuating a control circuit and which includes a signal translating channel having a variable gain amplifier, and a control circuit coupled to said signal translating channel for actuation by a received signal of said predetermined frequency, the combination of means providing a first detector in said signal translating channel for deriving a first control voltage as a function of signal energy in a wide frequency band, means providing a second detector in said signal translating channel for deriving a second control voltage as a function of signal energy in a narrow band of frequencies within said wide band of frequencies, said narrow band of frequencies including said predetermined frequency, and means for applying said first and second control voltages to said variable gain amplifier to control the gain thereof as an inverse function of received signal energy level.

2. In a remote control receiver of the type which is responsive to a transmitted control signal of a predetermined frequency for actuating a control circuit the combination comprising, a relatively wide frequency pass band signal translating channel having an output circuit and including means for deriving a first gain controlling voltage in response to signals in said relatively wide pass band, a further signal translating channel having a relatively narrower frequency pass band within said relatively wide frequency pass band corresponding to said predetermined frequency coupled to said output circuit and including means for deriving a second gain controlling voltage in response to signals in said relatively narrower pass band, means for applying said first and second control voltages to control the gain of said relatively wide pass band signal translating channel as an inverse function of received signal level, and control circuit means coupled to said relatively narrower frequency band signal translating channel for actuation in response to a received control signal of said predetermined frequency.

3. In a remote control receiver of the type which is responsive to a transmitted control signal of predetermined frequency for actuating a control circuit and which includes a variable gain amplifier channel, the combination of means providing a wide frequency band detector coupled to said variable gain amplifier channel for deriving a first control voltage as a function of received signal energy in said wide band, means providing a narrow frequency band detector coupled to said signal translating channel for deriving a second control voltage as a function of received signal energy in said narrow frequency band, said narrow frequency band including said predetermined frequency, and means for applying said first and second control voltages to said variable gain amplifier channel to control the gain thereof inversely with received signal energy, and a control circuit coupled to said narrow frequency band detector for actuation thereby in response to a received control signal of said predetermined frequency.

4. A remote control receiver of the type which is responsive to a transmitted control signal of predetermined frequency for actuating a control circuit comprising in combination, a relatively wide frequency pass band signal amplifying channel for providing variable gain amplification of a received control signal, means providing a first detector in said variable gain amplifying channel for deriving a first gain controlling voltage in response to signal energy in said relatively wide frequency pass band, a resonant circuit tuned to said predetermined frequency coupled to said variable gain amplifying channel, means providing a second detector coupled to said resonant circuit for deriving a control signal and a second gain controlling voltage in response to a received control signal, means for applying said first and second gain controlling voltages to said variable gain amplifying channel to control the gain thereof as an inverse function of received signal energy level, and control circuit means coupled to said second detector for actuation in response to the control signal produced by said second detector in response to a received control signal of said predetermined frequency.

5. In a remote control receiver of the type which is responsive to a transmitted control signal of predetermined frequency for actuating a control circuit comprising in combination, a relatively wide frequency pass band variable gain signal amplifying channel having an output circuit, means providing a detector in said signal amplifying channel for deriving a first gain controlling voltage in response to signals in said relatively wide frequency pass band, a resonant circuit tuned to said predetermined frequency coupled to said output circuit, rectifying means coupled to said resonant circuit to derive a second gain controlling voltage in response to signals of a frequency falling within the pass band of said resonant circuit, means for applying said first gain controlling voltage to said rectifying means to provide an increasing reverse bias therefor with increasing signal levels in said relatively wide frequency pass band, means for applying said first and second gain controlling voltages to said variable gain signal amplifying channel to control the gain thereof as an inverse function of received signal level, and control circuit means coupled to said rectifying means for actuation thereby in response to a received signal of said predetermined frequency.

6. A remote control receiver of the type which is responsive to a transmitted control signal of a predetermined frequency for actuating a control circuit comprising in combination, means providing a variable gain amplifying stage for translating signals in a relatively wide frequency pass band, a power amplifying stage coupled to said variable gain amplifying stage, said power amplifying stage including an input electrode, an output electrode and a common electrode, circuit means connected between said input electrode and said output electrode for deriving a first gain controlling voltage the magnitude of which is a function of the applied signal level, means providing a parallel resonant circuit tuned to said predetermined frequency connected between said output and common electrodes, a rectifier coupled to said resonant circuit for deriving a second gain controlling voltage the amplitude of which is a function of the received signal level of signals having a frequency within the pass band of said resonant circuit, means connected to apply said first and second gain controlling voltage to said variable gain amplifier, and control circuit means coupled to said rectifier for actuation in response to a received signal of said predetermined frequency.

7. A remote control receiver of the type which is responsive to a transmitted control signal of a predetermined frequency for actuating a control circuit comprising in combination, means providing a variable gain amplifying stage for translating signals in a relatively wide frequency pass band, a power amplifying stage coupled to said variable gain amplifying stage, said power amplifying stage including an input electrode, an output electrode and a common electrode, circuit means connected between said input electrode and said output electrode for deriving a first gain controlling voltage the magnitude of which is a function of the applied signal level, means providing a parallel resonant circuit tuned to said predetermined frequency connected between said output and common electrodes, a rectifier coupled to said resonant circuit for deriving a second gain controlling voltage the amplitude of which is a function of the received signal level of signals having a frequency within the pass band of said resonant circuit, means for applying said first gain controlling voltage to said rectifier to provide an increase in reverse bias therefor in response to increases in received signal level, means connected to apply said first and second gain controlling voltage to said variable gain amplifier to maintain the signal level applied to said power amplifying stage substantially constant, and control circuit means coupled to said rectifier for actuation in response to a received signal of said predetermined frequency.

8. In a remote control receiver responsive to transmitted control signals in a narrow band of frequencies for actuating a controlled circuit, the combination comprising an aperiodic and variable gain amplifier responsive to received signals in a wide band of frequencies, said wide band of frequencies including said narrow band of frequencies, rectifying means coupled to said amplifier for deriving a control voltage as a function of the energy level of said signals in said wide band of frequencies, means for applying said control voltage to said amplifier to control the gain thereof as an inverse function of the level of said signals in said wide band of frequencies, and discriminator means coupled to said amplifier and actuated by said signals in said narrow band of frequencies for deriving a second control voltage for actuating said controlled circuit.

9. In remote actuation and control apparatus of the type including a transmitter adapted to radiate supersonic signals and a receiver adapted to receive and convert said control signals into electrical energy for actuation and control purposes, a receiver circuit including in combination:

an electro-mechanical transducer responsive to supersonic control signals radiated by a remote transmitter to produce corresponding electrical signals;

a wideband resistance-capacitance coupled amplifier having an input terminal and an output terminal, and responsive to electrical impulses in a wide band of frequencies which includes and is larger than the frequency band of said supersonic control signals;

means coupling said amplifier input terminal to the transducer to receive and amplify the electrical output therefrom, means responsive to signals in said wide band of frequencies for controlling the input/output translation characteristic of said amplifier whereby the output amplitude of signals from said amplifier is substantially constant with respect to the amplitude of the signals applied thereto from said transducer;

means including a relatively narrow frequency band filter circuit coupled to said amplifier output circuit for receiving the amplified output therefrom, said narrow frequency band filter circuit passing the frequency band of said supersonic control signals to the relative exclusion of other frequencies to which the transducer responds, and utilization means coupled to said narrow frequency band filter circuit.

10. In remote actuation and control apparatus of the type including a transmitter adapted to radiate supersonic control signals and a receiver adapted to convert the received control signals into electrical energy for actuation and control purposes, a receiver circuit including in combination:

an electro-mechanical transducer responsive to supersonic control signals radiated by a remote transmitter to produce corresponding electrical signals, a wide band resistance-capacitance coupled amplifier having at least a first stage and an output stage, said stages responsive to electrical impulses in a wide band of frequencies which includes and is large with respect to the frequency band of said supersonic control signals, means coupling said first amplifier stage to the transducer to receive and amplify the electrical output therefrom, said output amplifier stage including a tube having a grid cathode and anode electrodes, resistance-capacitance circuit means for applying signals from said first stage between said grid and cathode electrodes of said output stage to cause grid current flow as a function of the strength of signals in said wide band, circuit means coupling said grid-cathode circuit of said output stage with said first stage to control the gain thereof as an inverse function of the amount of energy present in said wide band of signals, means including a relatively narrow frequency band filter circuit coupled to said output amplifier tube anode electrode for receiving the amplified output therefrom, said narrow frequency band filter circuit tuned to pass the frequency band of said supersonic control signals to the relative exclusion of other frequencies to which the transducer responds, and utilization means coupled to said narrow frequency band filter circuit.

11. A remote actuation and control apparatus of the type including a transmitter adapted to radiate relatively fixed frequency supersonic control signals and a receiver adapted to convert the received control signals into electrical energy for actuation and control purposes, a receiver circuit including in combination:

a microphone responsive to supersonic control signals to produce corresponding electrical signals, a wide band amplifier having at least a first and second amplifier stages including respectively amplifier devices having input, output and common electrodes, said amplifier responsive to signals in a band of frequencies that includes and is large with respect to the frequency band of said control signals, means coupling said microphone between the input and common electrodes of the device for said first amplifier stage, resistance-capacitance coupling means for coupling the output electrode of said first stage to the input electrode of said second stage so that signals in a wide frequency band are applied between the input and common electrodes of said second stage, said last named means including a resistor providing a direct current path between the input and common electrodes of said second stage so that the current in said direct current path is a function of energy in said wide band to change the bias between the input and common electrodes of said second stage in a direction to reduce the transmission efficiency of said second stage with increases in energy in said wide band and vice versa, means including a relatively narrow frequency band filter circuit coupled to the output electrode of said second stage, said narrow frequency band circuit passing the frequency band of said supersonic control signals to the relative exclusion of other frequencies to which the microphone responds, and utilization means coupled with the narrow frequency band filter circuit.

References Cited in the file of this patent

UNITED STATES PATENTS

| | | |
|---|---|---|
| 2,121,427 | Fowler | June 21, 1938 |
| 2,203,498 | Koch | June 4, 1940 |
| 2,251,382 | Sziklai | Aug. 5, 1941 |
| 2,400,948 | Peterson | May 28, 1946 |
| 2,500,505 | Arnold | Mar. 14, 1950 |
| 2,724,074 | Welker | Nov. 15, 1955 |
| 2,791,690 | Dodington | May 7, 1957 |
| 2,932,736 | Birkenes et al. | Apr. 12, 1960 |